(12) United States Patent
Pfeiffer et al.

(10) Patent No.: US 6,633,040 B1
(45) Date of Patent: Oct. 14, 2003

(54) SOLENOID ELECTRON BEAM LENSES WITH HIGH DEMAGNIFICATION AND LOW ABERRATIONS

(75) Inventors: Hans C. Pfeiffer, Ridgefield, CT (US); Maris A. Sturans, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/132,896

(22) Filed: Apr. 25, 2002

(51) Int. Cl.[7] ............................................. H01J 37/302
(52) U.S. Cl. ............................................. 250/396 ML
(58) Field of Search ................................. 250/396 ML

(56) References Cited

U.S. PATENT DOCUMENTS

| | | | |
|---|---|---|---|
| 3,666,985 A | * | 5/1972 | Schlesinger ............... 315/382.1 |
| 4,521,901 A | * | 6/1985 | Rand ............................ 378/138 |
| 4,945,246 A | | 7/1990 | Davis et al. |
| 5,962,859 A | | 10/1999 | Groves et al. |
| 5,981,962 A | | 11/1999 | Groves et al. |
| 6,175,122 B1 | | 1/2001 | Groves et al. |

* cited by examiner

Primary Examiner—John R. Lee
Assistant Examiner—James J Leybourne

(57) ABSTRACT

A magnetic lens employs a solenoid field containing a passive pole piece that shapes the solenoid field to create a demagnifying lens that has very low geometrical aberrations by adjusting the field upstream and downstream of the gap between the pole pieces to create a negative term in the formula for spherical aberrations, subtracting a significant amount from the contribution to the aberrations that comes from the field in the gap.

13 Claims, 5 Drawing Sheets

SOLENOID ELECTRON BEAM LENSES WITH HIGH DEMAGNIFICATION AND LOW ABERRATIONS

FIELD OF THE INVENTION

The field of the invention is electron beam lithography, in particular, low-aberration magnetic lenses.

BACKGROUND OF THE INVENTION

A uniform magnetic field (solenoid field) oriented along the electron beam axis is the simplest of electron lenses and has been employed in various electron beam systems. Electrons radiating from a point object execute, by virtue of their transverse velocity component, one cyclotron orbit in the transverse plane, returning to the optic axis. Thus, an image is formed with unity magnification. A major advantage of the solenoid lens is that there is no prescribed optic axis, hence a shift (deflection) of the beam by a transverse field will cause the beam to shift position, but maintain the same focal plane. A major disadvantage of these lenses is that they produce no demagnification of the object, so that defects in the source (reticle, shaping aperture) are reproduced in the image.

The classical solenoid field periodic focusing is depicted in FIGS. 5A and 5B. FIG. 5A shows a cross section of solenoid 5, with the drawing convention that the wires in the coil are denoted by "X" s 10 and 12, one of the sides being wires carrying current forward out of the plane of the paper to the viewer and the other being wires carrying current out of the plane of the paper away from the viewer. The uniform solenoid field 23 of solenoid 5 has no predefined optic axis and periodically focuses the beam with one to one magnification, as shown in the beam trace plot in FIG. 5B, in which beam trace 120 comes to a focus at regular intervals with a periodicity determined by the beam energy (acceleration potential) and the strength of the solenoid field.

SUMMARY OF THE INVENTION

The invention relates to a magnetic lens employing a solenoid field and having substantial demagnification.

A feature of the invention is the introduction of passive magnetic pole pieces in the solenoid field in such a way as to produce high demagnification of the object with very low geometric aberrations.

DESCRIPTION OF THE PREFERRED EMBODIMENT

The restriction of lenses formed by solenoid fields in the prior art to a one-to-one object to image ratio imposes severe limitations on the image quality. In the case of a shaped-beam system, such as the EL series made by IBM, imperfections in the aperture result in the same imperfections in the image. It is well known that the conventional object to image ratio of 4:1 in optical steppers is more "forgiving", in the sense that imperfections in the reticle are reduced by the demagnification ratio.

Figure 2:
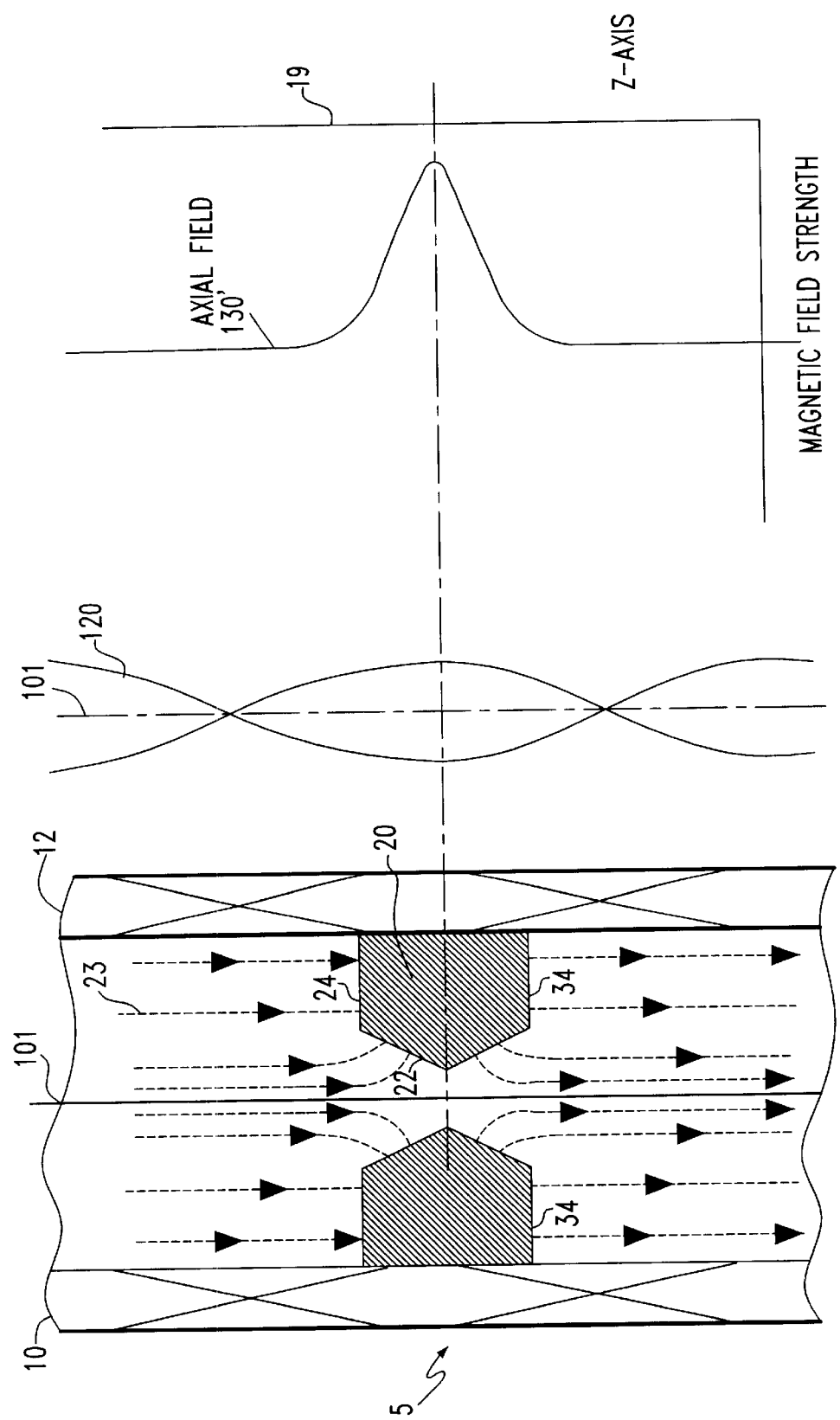
FIGS. 2A, 2B and 2C show a cross section of another embodiment of the invention, an associated beam trace and an associated plot of field strength.

According to the subject invention, the introduction of high permeability magnetic material (pole pieces), such as shown in FIGS. 2A–2C, modifies the magnetic field lines to form a weak demagnification lens. Illustratively, the material is Ferrite™, a ceramic with high magnetic permeability, available from the Ceramic Magnetics company. Referring now to FIG. 2A, solenoid 5 now has a pole piece 20 with top surface 24 and two abutting pole tips 22, which make an acute angle with respect to the system axis 101. As is conventional, solenoid 5 and pole piece 20 have cylindrical symmetry. Beam trace 120 in FIG. 2B shows the demagnification. FIG. 2C shows the field strength in the z-direction (vertically in FIG. 2A). This example of a lens according to the invention has a demagnification of 1.2.

Figure 3:
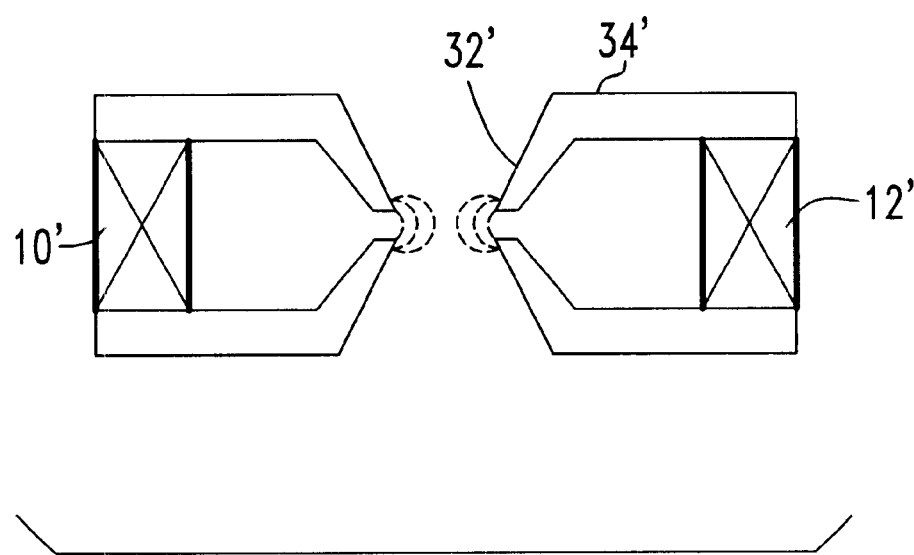
FIG. 3 shows a prior art lens.

Referring now to FIG. 3, a conventional prior art magnetic lens is shown having flat top plate 34' of magnetically permeable material, coils 10 and 12 positioned within the region defined by plates 34 and magnetically permeable pole tips 32'. Pole tips 32' are separated by gap 33 such that the magnetic field between the gaps has the correct spatial dependence for focusing a beam. Those skilled in the art are aware that such lenses are designed to concentrate the field in gap 33, leaving essentially no residual field outside (above and below plates 34).

Figure 1:
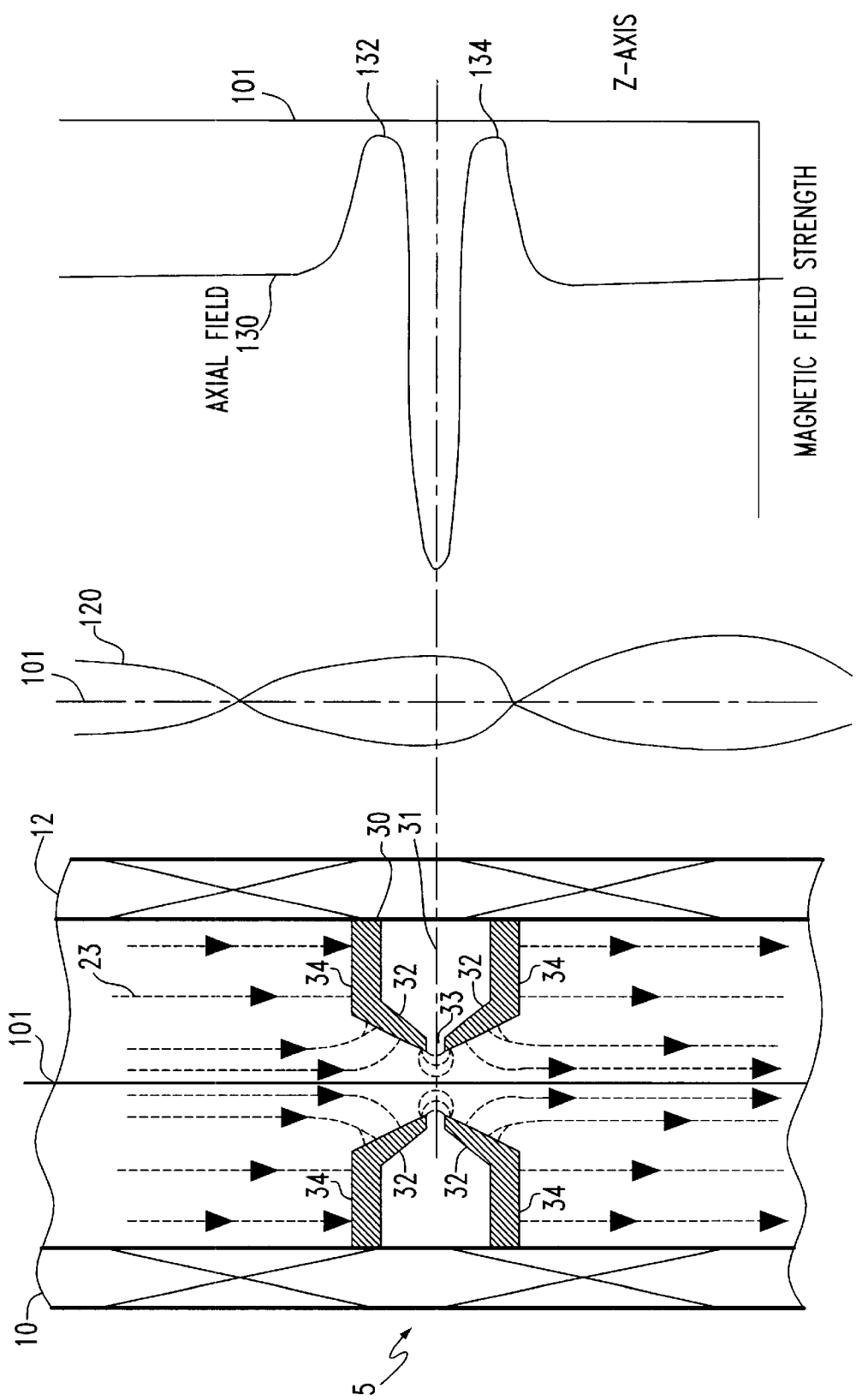
FIGS. 1A, 1B and 1C show a cross section of an embodiment of the invention, an associated beam trace and an associated plot of field strength.

A much more powerful demagnification can be obtained with the pole piece geometry shown in FIG. 1A. Here the axial solenoid field is modified by pole piece 30 to have a very strong peak in the pole piece gap (also referred to as the lens gap) 33 with negative side lobes (relative to the uniform solenoid field). Pole piece 30 has flat top and bottom surfaces 34 and two pole tips 32, having outer surfaces that make an acute angle with respect to the solenoid axis 101 and are separated by gap 33 positioned about a transverse plane denoted by numeral 31. Typically, the pole tip surfaces have an angle of less than 45 degrees with respect to the geometric axis. This pole piece configuration has been shown to easily provide demagnification in the 10X range (shown in beam trace 120 in FIG. 1B), with spherical and chromatic aberration coefficients below 3 mm.

Those skilled in the art will appreciate, in light of this disclosure, that the unexpectedly low values for the spherical aberration results from the ability of a lens according to the invention to create the dips in magnetic field strength 132 and 134, which have no counterparts in a conventional lenses such as that shown in FIG. 3, in which coils 10', 12' generate flux lines within the pole piece. A standard textbook, "Electron and Ion Optics", Miklos Szilagy, Plenum Press, 1988, p. 401, shows in Equation 5–135 that the coefficient of spherical aberration depends on an integral having three terms. The first two terms are always positive and the third, negative, term is proportional to the product $B(z)B''(z)$. Having this term negative is equivalent to having flux density distributions that are always convex toward the axis; i.e. that have a minimum for positive $B(z)$.

Figures 4A, 4B:
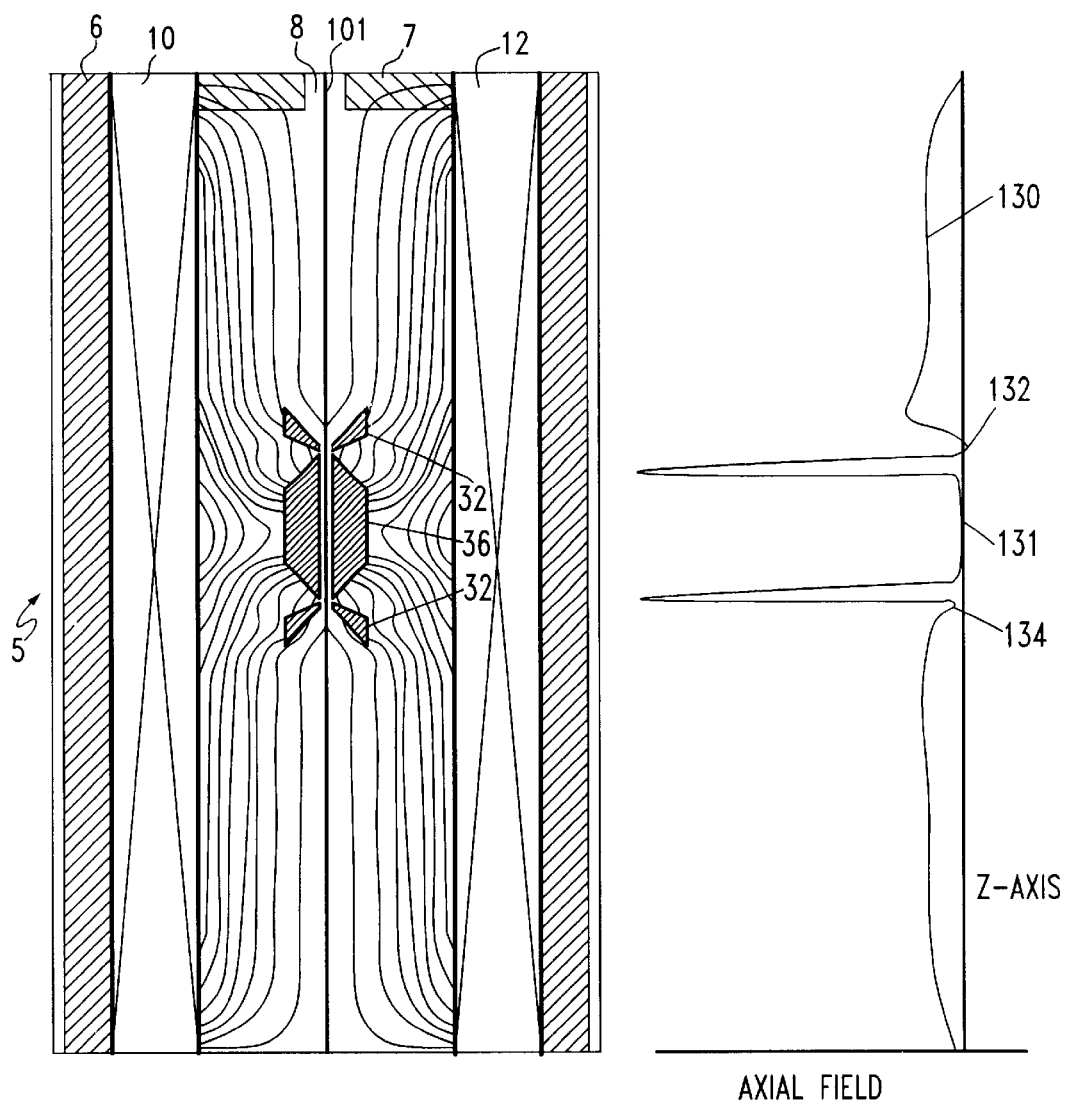
FIGS. 4A and 4B show another embodiment of the invention and an associated plot of field strength.
Figures 5A, 5B:
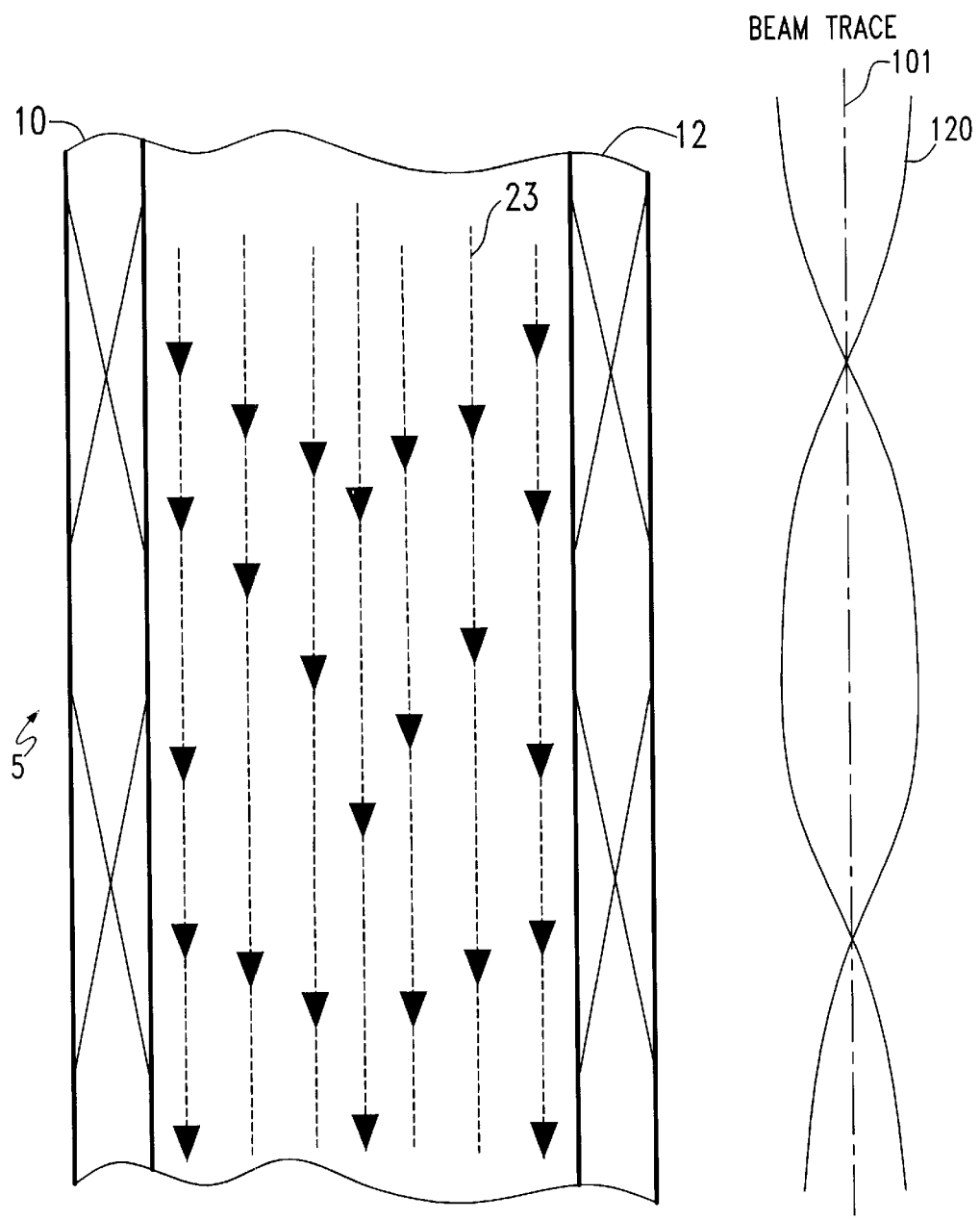
FIGS. 5A and 5B show the prior art focusing action of a solenoid field.

To achieve even higher demagnification, two or more of these lenses can be used in the same solenoid field, illustrated in FIGS. 4A and 4B. There, pole pieces 32 are the same as those in FIG. 1A. Segments 34 of the poles are not used in this illustration, but could be added to further strengthen the lens field in the pole piece gap, and thereby increase the demagnification. An optional permeable member 36, of the same permeable material, merges with lower pole piece 32 of the upper pair and with the upper pole piece 32 of the lower pair, so that a single piece of material conducts the field lines from the upper gap to the lower gap. A single piece eliminates problems with misalignment between the pieces, but is not required. So long as the three pieces abut and carry the field lines, separate pieces can be used. Filling the region between the two lenses with high permeability magnetic material to produces a field-free region that can be used for separation and demagnification purposes. With this arrangement we obtained demagnification greater than 80X, while maintaining spherical and chromatic aberration below 4 mm. Other parameters are: a beam voltage of 10keV, magnification in the upper section of 0.133, magnification in the lower section of 0.086, giving a total demagnification of 87 and $C_{SI}$=3.25 mm, $C_c$=3.83 mm. The excitation of solenoid 5 was 6200 ampere-turns. The diameter of the bore through the pole pieces was 4 mm and the lens gaps were 4 mm for the upper section, with 7mrad aperture angle at the second image plane. Plane 202 is the object plane and plane 204 is the second image plane in this case. There will be an intermediate image plane somewhere in the region covered by member 36. The total length from the object plane to the second image plane was 112 mm.

The pole pieces can also be arbitrarily positioned within solenoid 5 in the X-Y plane and do not have to extend to the outer diameter, though that is convenient for mechanical support. The field-free region provided by member 36 is not required, but it provides more freedom to choose the intermediate image plane location and to select first and second lens demagnifications independently.

Using this basic principle, an entire electron optics column can be fabricated inside one solenoid. A system following the teachings of U.S. Pat. No. 4,945,246 or other lithographic systems and including an electron source, a first shaping aperture for defining a beam having a square cross section, deflection members and drivers for directing the beam at a second shaping aperture to define a rectangular shaped beam of desired size, the demagnification section illustrated herein, and a drift/deflection region to direct the shaped rectangle to a desired location, all in accordance with standard practice in the field could be constructed and would benefit from the small aberration coefficients available with this invention.

Referring again to FIG. 4A, an optional transverse permeable cap 7, having an aperture 8 to permit passage of the beam, would isolate an upstream region from the field 23, permitting use of a different field strength in different regions. Another optional cap at the bottom could be used to perform similar isolation. The other upstream and/or downstream regions could have a solenoid field of a different strength or no solenoid field and conventional lenses, as is desired by the system designer.

The use of the subject invention is not confined to shaped beam systems and could be used with the Gaussian systems manufactured by Etec Corporation, a subsidiary of Applied Materials, or with a projection beam system such as that being developed by the IBM-Nikon team working on PREVAIL technology.

While the invention has been described in terms of a few preferred embodiments, those skilled in the art will recognize that the invention can be practiced in various versions within the spirit and scope of the following claims.

We claim:

1. A magnetic lens comprising:
   means for generating a solenoid magnetic field along a first direction; and
   at least one magnetically permeable pole piece disposed within said solenoid magnetic field, said pole piece having a geometric axis parallel to said first direction and at least two beam-shaping pole tips disposed above and below a first transverse plane perpendicular to said geometric axis.

2. A magnetic lens according to claim 1, in which a first two of said at least two beam-shaping pole tips are separated by a first lens gap.

3. A magnetic lens according to claim 1, in which a first two of said at least two beam-shaping pole tips are abutting.

4. A magnetic lens according to claim 2, further comprising a second two of said at least two beam-shaping pole tips separated by a second lens gap, said second two beam-shaping pole tips being disposed below said first two of said at least two beam-shaping pole tips and disposed above and below a second transverse plane perpendicular to said geometric axis.

5. A magnetic lens according to claim 4, further comprising a magnetically permeable member disposed between a lower one of said first two beam-shaping pole tips and an upper one of said second two beam-shaping pole tips, whereby a continuous magnetically permeably path extends between said first lens gap and said second lens gap.

6. A method according to claim 5, in which a lower one of said first two beam shaping pole tips, an upper one of said second two beam shaping pole tips and said magnetically permeable member form a single integrated unit.

7. A magnetic lens according to claim 1, in which a first two of said at least two beam-shaping pole tips have outer surfaces that are less that 45° from said geometric axis.

8. A magnetic lens according to claim 2, in which a first two of said at least two beam-shaping pole tips have outer surfaces that are less that 45° from said geometric axis.

9. A magnetic lens according to claim 4, in which a first two of said at least two beam-shaping pole tips have outer surfaces that are less that 45° from said geometric axis.

10. A magnetic lens according to claim 5, in which a first two of said at least two beam-shaping pole tips have outer surfaces that are less that 45° from said geometric axis.

11. A magnetic lens according to claim 1, further comprising at least one permeable transverse cap disposed at one of a top and bottom of said magnetic lens, whereby said solenoid field is confined within said lens at said transverse cap.

12. A magnetic lens according to claim 2, further comprising at least one permeable transverse cap disposed at one of a top and bottom of said magnetic lens, whereby said solenoid field is confined within said lens at said transverse cap.

13. A magnetic lens according to claim 4, further comprising at least one permeable transverse cap disposed at one of a top and bottom of said magnetic lens, whereby said solenoid field is confined within said lens at said transverse cap.

* * * * *